(12) United States Patent
Deng

(10) Patent No.: US 10,834,850 B2
(45) Date of Patent: Nov. 10, 2020

(54) INTEGRATED RADIATOR PROVIDED WITH WATER CHAMBER, CONTROL PANEL AND WATER PUMP

(71) Applicant: Dongguan Jianxin Electronic Technology Co., Ltd., Dongguan (CN)

(72) Inventor: Haoqiang Deng, Dongguan (CN)

(73) Assignee: Dongguan Jianxin Electronic Technology Co., Ltd., Dongguan (CN)

( * ) Notice: Subject to any disclaimer, the term of this patent is extended or adjusted under 35 U.S.C. 154(b) by 24 days.

(21) Appl. No.: 16/397,827

(22) Filed: Apr. 29, 2019

(65) Prior Publication Data

US 2020/0236807 A1 Jul. 23, 2020

(30) Foreign Application Priority Data

Jan. 23, 2019 (CN) .......................... 2019 1 0063102
Jan. 23, 2019 (CN) ...................... 2019 2 0121197 U

(51) Int. Cl.
| | |
|---|---|
| *H05K 7/20* | (2006.01) |
| *F28D 1/053* | (2006.01) |
| *F28F 9/02* | (2006.01) |
| *F28F 1/02* | (2006.01) |
| *F28F 1/12* | (2006.01) |
| *H01L 23/473* | (2006.01) |
| *F28D 21/00* | (2006.01) |

(52) U.S. Cl.
CPC ..... *H05K 7/20327* (2013.01); *F28D 1/05383* (2013.01); *F28F 9/0246* (2013.01); *H05K 7/20309* (2013.01); *F28D 2021/0091* (2013.01); *F28F 1/022* (2013.01); *F28F 1/126* (2013.01); *F28F 2250/08* (2013.01); *H01L 23/473* (2013.01); *H05K 7/20263* (2013.01); *H05K 7/20272* (2013.01)

(58) Field of Classification Search
CPC ............ H05K 7/20272; H05K 7/20263; H01L 23/473; F28D 1/05383; F28D 1/05341; F28D 2021/0091; F28F 2250/08
See application file for complete search history.

(56) References Cited

U.S. PATENT DOCUMENTS

| | | | | |
|---|---|---|---|---|
| 4,236,970 A | * | 12/1980 | Harand | ................... F22B 1/023 165/158 |
| 6,749,012 B2 | * | 6/2004 | Gwin | ...................... F28F 9/002 165/104.33 |
| 7,280,357 B2 | * | 10/2007 | Tomioka | ............. F04D 29/5866 165/80.4 |

(Continued)

*Primary Examiner* — Paul Alvare
(74) *Attorney, Agent, or Firm* — Wang Law Firm, Inc.

(57) ABSTRACT

The invention relates to the technical field of water-cooling radiators, in particular to an integrated radiator provided with a water chamber, a control panel, and a water pump. The control panel is provided with a port set electrically connected with the control panel. According to the integrated radiator, the water pump assembly is integrated on the cooler through reasonable design, so that the weight of a block is effectively reduced. Meanwhile, wires of a fan and the block are connected to the port set on the control panel to be prevented from being suspended in a case, so that the internal attractiveness of the case is improved; besides, more cooling liquid is contained, so that the service life of the integrated water-cooling radiator is prolonged.

8 Claims, 5 Drawing Sheets

(56) References Cited

U.S. PATENT DOCUMENTS

| | | | | |
|---|---|---|---|---|
| 7,424,907 B2* | 9/2008 | Chou | .................... | F28D 1/0477 |
| | | | | 165/104.33 |
| 8,051,898 B2* | 11/2011 | Chiang | ................ | H01L 23/473 |
| | | | | 165/80.4 |
| 9,600,044 B2* | 3/2017 | Liao | ....................... | G06F 1/1635 |
| 10,058,009 B2* | 8/2018 | Huang | ................ | H05K 7/1461 |
| 2004/0008483 A1* | 1/2004 | Cheon | ....................... | G06F 1/20 |
| | | | | 361/679.53 |
| 2005/0052847 A1* | 3/2005 | Hamman | ............. | F28D 1/0535 |
| | | | | 361/699 |
| 2006/0051222 A1* | 3/2006 | Lee | ....................... | F04D 13/064 |
| | | | | 417/423.14 |
| 2006/0185378 A1* | 8/2006 | Duan | ................ | H05K 7/20263 |
| | | | | 62/259.2 |
| 2009/0044929 A1* | 2/2009 | Yeh | ....................... | H01L 23/473 |
| | | | | 165/104.19 |
| 2013/0299139 A1* | 11/2013 | Mounioloux | ............. | G06F 1/20 |
| | | | | 165/120 |
| 2017/0027081 A1* | 1/2017 | Zhang | ................ | H05K 7/20254 |
| 2018/0094633 A1* | 4/2018 | Huang | ................ | F04D 29/605 |
| 2019/0075681 A1* | 3/2019 | Xiao | ....................... | F28F 1/126 |
| 2019/0107122 A1* | 4/2019 | Shen | ................ | H05K 7/20272 |
| 2019/0249939 A1* | 8/2019 | Otsuki | .................. | H01L 23/473 |
| 2019/0339026 A1* | 11/2019 | Chen | ........................ | F28F 3/12 |
| 2019/0343018 A1* | 11/2019 | Chen | ................. | H05K 7/20272 |

* cited by examiner

INTEGRATED RADIATOR PROVIDED WITH WATER CHAMBER, CONTROL PANEL AND WATER PUMP

BACKGROUND OF THE INVENTION

1. Technical Field

The invention relates to the technical field of water-cooling radiators, in particular to an integrated radiator provided with a water chamber, a control panel, and a water pump.

2. Description of Related Art

In the DIY field of computer fittings, water-cooling radiators are always the first choice for high-end computer players to configure computers. Compared with air-cooling radiators, the water-cooling radiators have a better cooling effect on over-clocking CPUs, but correspondingly, a larger case space is required for receiving the water-cooling radiators. Traditional water-cooling radiators include integrated water-cooling radiators and split-type water-cooling radiators, wherein the integrated water-cooling radiators typically consist of a block, a cooler, and a fan arranged on the cooler.

The traditional water-cooling radiators have a water pump installed on the block. However, since the computer case is generally vertically placed, a mainboard and a CPU have to be vertically configured in the case so as to adapt to the internal structure of the case, the block is installed on the CPU of the mainboard, and when operating, the water pump inevitably generates vibration, which will affect normal work of the CPU and result in instability during work of the CPU. In addition, a load is exerted by the weight of the water pump on the block and the mainboard, which will, over time, accelerate the aging of screws with which the mainboard and the case are connected and will even, in a severe case, lead to detachment of the mainboard, and consequentially, computer fittings installed on the mainboard are damaged. The traditional integrated water-cooling radiators are not provided with a water chamber, water chambers are only arranged at the upper end and the lower end of the cooler and are very small, and therefore, the cooler can only contain a small quantity of cooling liquid. As time passes, the quantity of the cooling liquid in the cooler is gradually decreased, the water pump cannot work normally anymore when this quantity is decreased to a limit, and in this case, the service life of the integrated water-cooling radiators is affected.

Besides, for most existing fans having an RGB effect, at least two wires, one of which is a fan power supply wire and the other is a lamp strip power supply wire, need to be guided out; for certain large-sized (such as 240 mm and 360 mm) coolers, at least four wires need to be guided out; all these wires should be connected with the mainboard for power supply and will be suspended after being connected with the mainboard, which severely affects the internal attractiveness of the case. In addition, in order to fulfill the RGB effect of the block, wires should be guided out of the block to be connected with the mainboard, which also severely affects the internal attractiveness of the case.

BRIEF SUMMARY OF THE INVENTION

The objective of the invention is to overcome the disadvantages and defects of the prior art by providing an integrated radiator provided with a water chamber, a control panel, and a water pump. According to the integrated radiator, a water pump assembly is integrated on a cooler through reasonable design, so that the weight of a block is effectively reduced; meanwhile, wires of a fan and the block are connected to a port set on the control panel to be prevented from being suspended in a case, so that the internal attractiveness of the case is improved; besides, a first water chamber is additionally integrated on the cooler, so that more cooling liquid is contained, and the service life of the integrated water-cooling radiator is prolonged.

The invention is implemented through the following technical solution:

An integrated radiator provided with a water chamber, a control panel, and a water pump comprises a cooler, a first water chamber, a control panel, and a water pump assembly, wherein cooling liquid is contained in the cooler; the first water chamber, the control panel, and the water pump assembly are arranged at one end or one side of the cooler, and the first water chamber and the water pump assembly are communicated with the cooler; and the water pump assembly is electrically connected with the control panel, and the control panel is provided with a port set electrically connected with the control panel.

Wherein, the first water chamber is communicated with a first water nozzle, and the water pump assembly is communicated with a second water nozzle.

Wherein, the cooler comprises a cooler body, a second water chamber, a third water chamber and an installation plate; the second water chamber and the third water chamber are separately arranged at two ends of the cooler body and are communicated with the cooler body, and the installation plate has an end face connected with one end of the second water chamber and an end face provided with the first water chamber; and the first water chamber, the installation plate, the second water chamber, the cooler body and the third water chamber are integrally formed through welding.

Wherein, the first water chamber is provided with a water injection hole.

Wherein, the water pump assembly comprises a stator, a mandrel, a rotor assembly, a water barrier cover and a shell; the shell is communicated with the cooler, and the mandrel, the rotor assembly and the water barrier cover are all located in the shell; a first groove is formed in the outer side of the shell, and the stator is received in the first groove; a second groove is formed in the inner side of the shell, a concave part of the second groove is located outside the shell to form a protrusion, the rotor assembly is received in the second groove, and the first groove is located around the protrusion; the mandrel penetrates through two ends of the rotor assembly to be connected with the water barrier cover and the shell, and the rotor assembly is rotatably connected with the mandrel; and the stator is arranged on one end face of the control panel and is electrically connected with the control panel.

Wherein, the rotor assembly comprises a bearing and a permanent magnet impeller, the bearing is arranged around the mandrel and is received in the permanent magnet impeller, and the mandrel penetrates through two ends of the bearing to be connected with the shell and the water barrier cover.

Wherein, the shell is provided with a plurality of positioning columns, and the control panel is provided with a plurality of second positioning holes matched with the positioning columns.

Wherein, a housing is arranged at one end of the cooler, and the first water chamber, the control panel, and the water pump assembly are all located in the housing; and the housing is provided with a plurality of through holes matched with the port set.

Wherein, the control panel comprises a water pump driver module and a port set power supply and control module, the water pump driver module is used for driving the water pump assembly, and the port set power supply and control module is used for supplying power and control signals to a water block and a fan.

The invention has the following beneficial effects:

1. The load of the mainboard is reduced. Particularly, according to the integrated radiator provided with the water chamber, the control panel, and the water pump, the water pump assembly is installed on the cooler, so that the weight of the block is reduced; and as the case is generally vertically placed, the reduction of the weight of the block reduces the load applied to the mainboard by the block, and accordingly, the service life of the mainboard is prolonged.

2. The stability of the CPU and the mainboard is prevented from being affected by the block. Particularly, based on the fact that the water pump generates vibration in work, the integrated radiator provided with the water chamber, the control panel, and the water pump in this embodiment has the water pump assembly installed on the cooler, and the block exchanges heat only with the CPU, so that the mainboard and the CPU can work without being affected by the water pump assembly, and accordingly, the working stability of the host is improved, and the service life of the host is prolonged.

3. The internal attractiveness of the case is improved. Particularly, the integrated radiator provided with the water chamber, the control panel, and the water pump in this embodiment has the control panel integrated on the cooler, wires guided out of the fan and the block of the radiator are reasonably configured on the cooler or a water pipe and are then inserted into the port set of the control panel for centralized power supply and control, and power supply lines are guided out of the control panel, so that the internal attractiveness of the case is maintained.

4. The service life of the integrated water-cooling radiator is prolonged. Particularly, the integrated radiator provided with the water chamber, the control panel, and the water pump has the first water chamber integrated on the cooler, so that more cooling liquid can be contained and can be supplemented in time, and therefore, the service life of the integrated water-cooling radiator is prolonged.

BRIEF DESCRIPTION OF THE SEVERAL VIEWS OF THE DRAWINGS

The invention is further explained below with reference to the accompanying drawings. However, embodiments in these drawings are not intended to limit the invention. For those ordinarily skilled in this field, other drawings can be obtained based on the following drawings without creative work.

1, cooler; 11, cooler body; 12, installation plate; 13, second water chamber; 14, third water chamber;

2, water chamber; 21, water injection hole;

3, control panel; 31, port set; 32, first positioning hole; 33, second positioning hole;

4, water pump assembly; 41, stator;

42, rotor assembly; 421, mandrel; 422, bearing; 423, permanent magnet impeller;

43, water barrier cover; 44, shell; 441, outlet;

45, first groove; 46, second groove; 47, protrusion; 48, positioning column; 49, housing; 40, through hole;

51, first water nozzle; 52, second water nozzle.

DETAILED DESCRIPTION OF THE INVENTION

Implementations of the invention are explained below with specific embodiments. Those skilled in this field can easily appreciate other advantages and effects of the invention by referring to the contents disclosed below. The invention can also be implemented or applied by means of other specific embodiments. All details in the description can be modified or changed in various ways based on different views and for different applications without deviating from the spirit of the invention.

By the way, the structures shown in these drawings are only used to provide a better understanding and reference for those familiar with the contents in the description in cooperation with these contents and should not be regarded as limits to the implantations of the invention, thereby not possessing any essential technical significance. Any structural modifications or amendments achieved without affecting the effects and objectives to be fulfilled by the invention should also fall within the scope defined by the technical contents of the invention.

Figure 1:
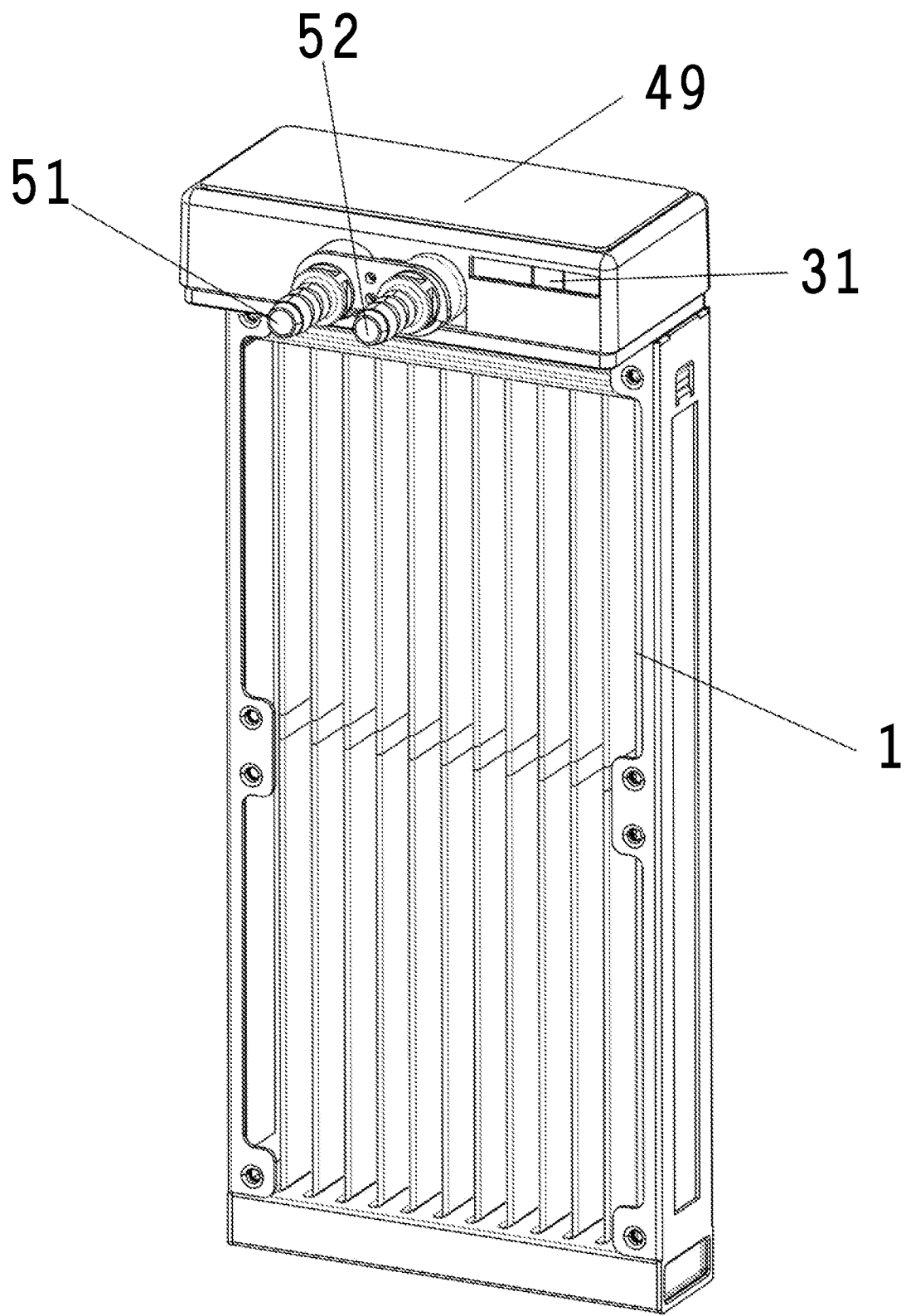
FIG. 1 is a perspective view of the invention.
Figure 2:
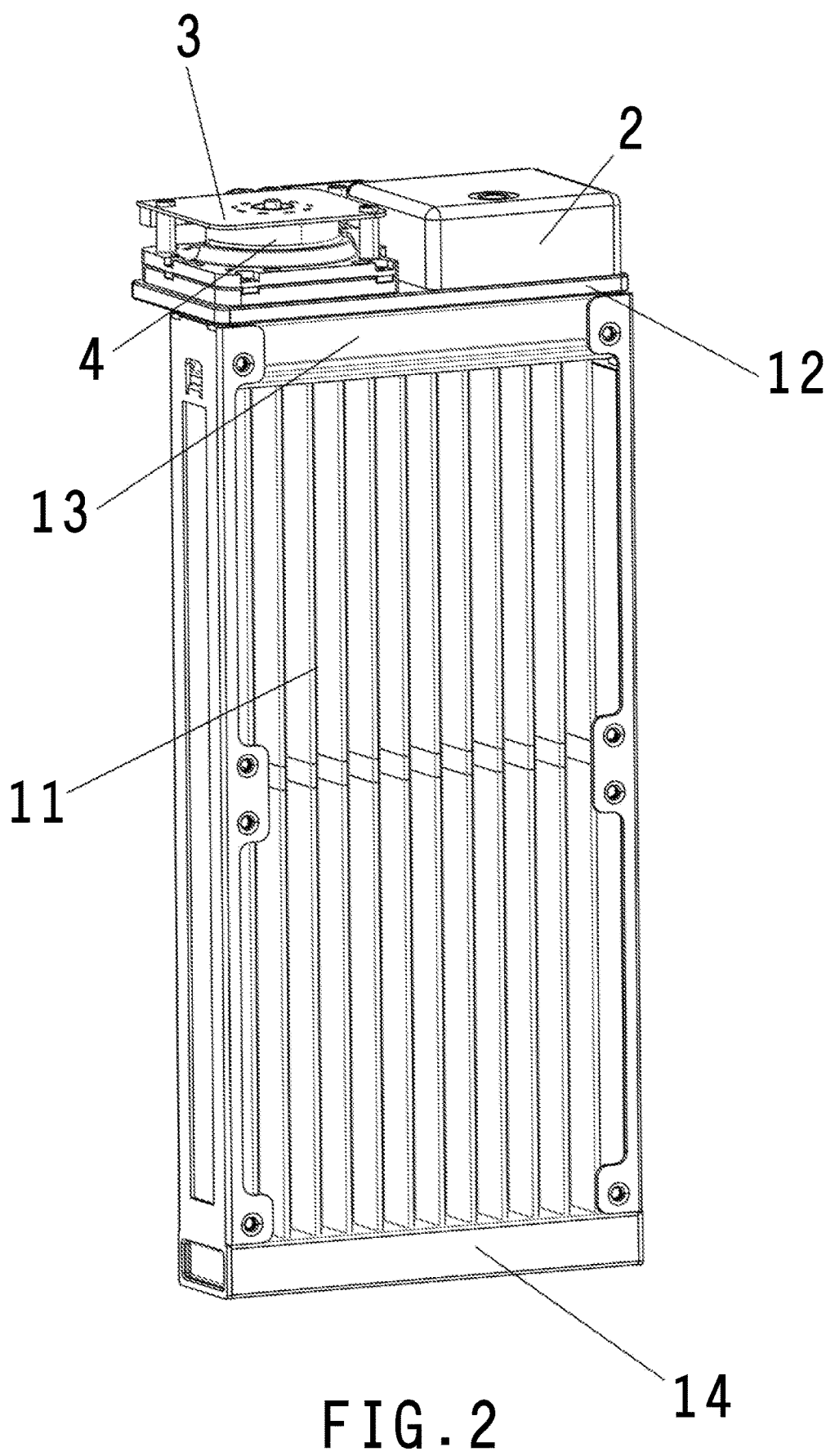
FIG. 2 is an internal view of the invention.
Figure 3:
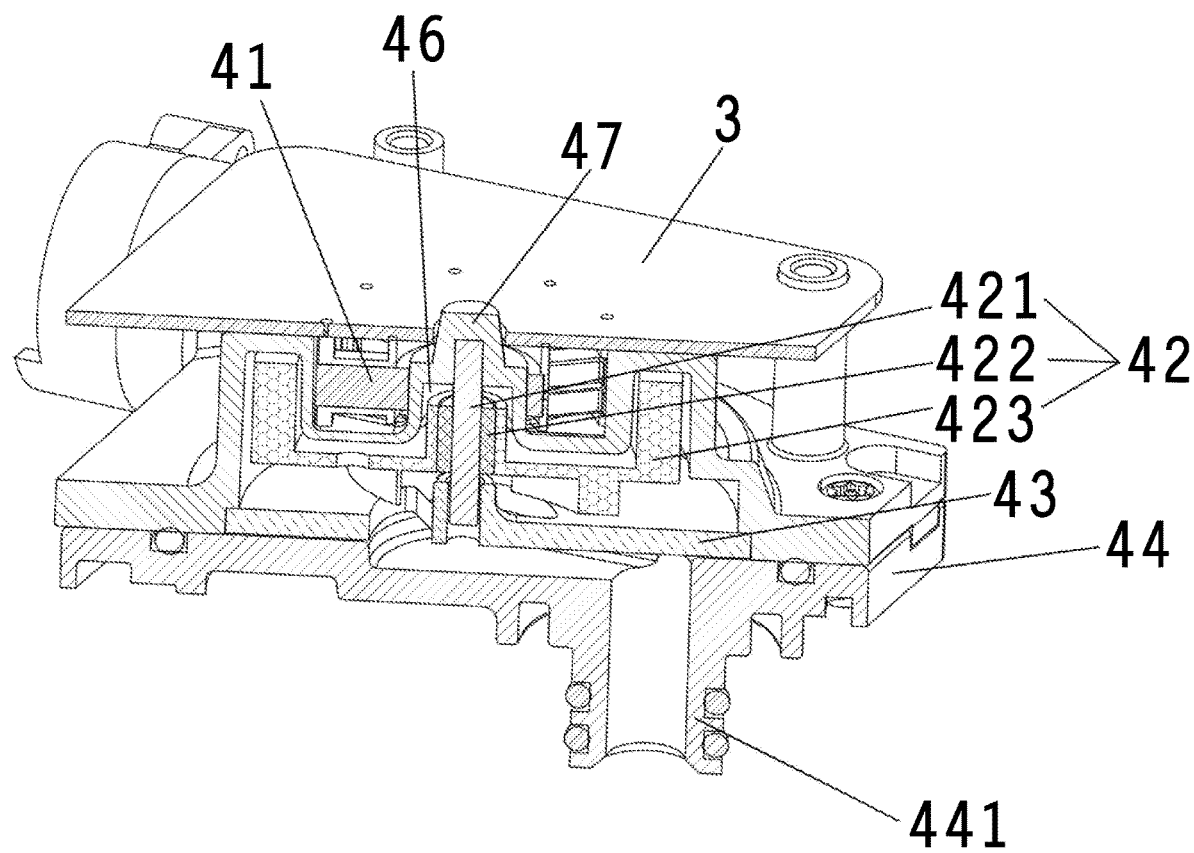
FIG. 3 is a sectional view of a water pump assembly of the invention.
Figure 4:
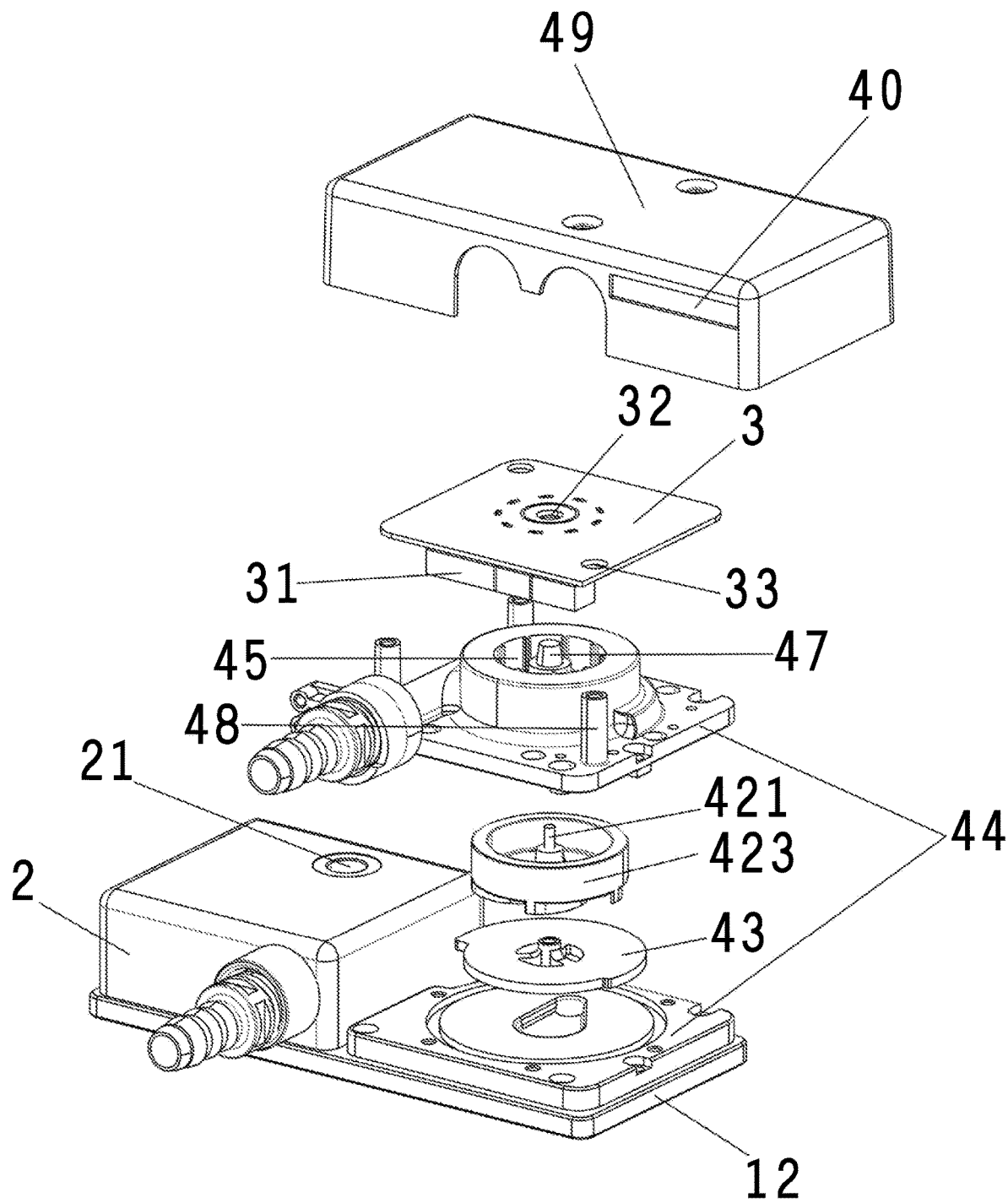
FIG. 4 is an exploded view of the water pump assembly of the invention.
Figure 5:
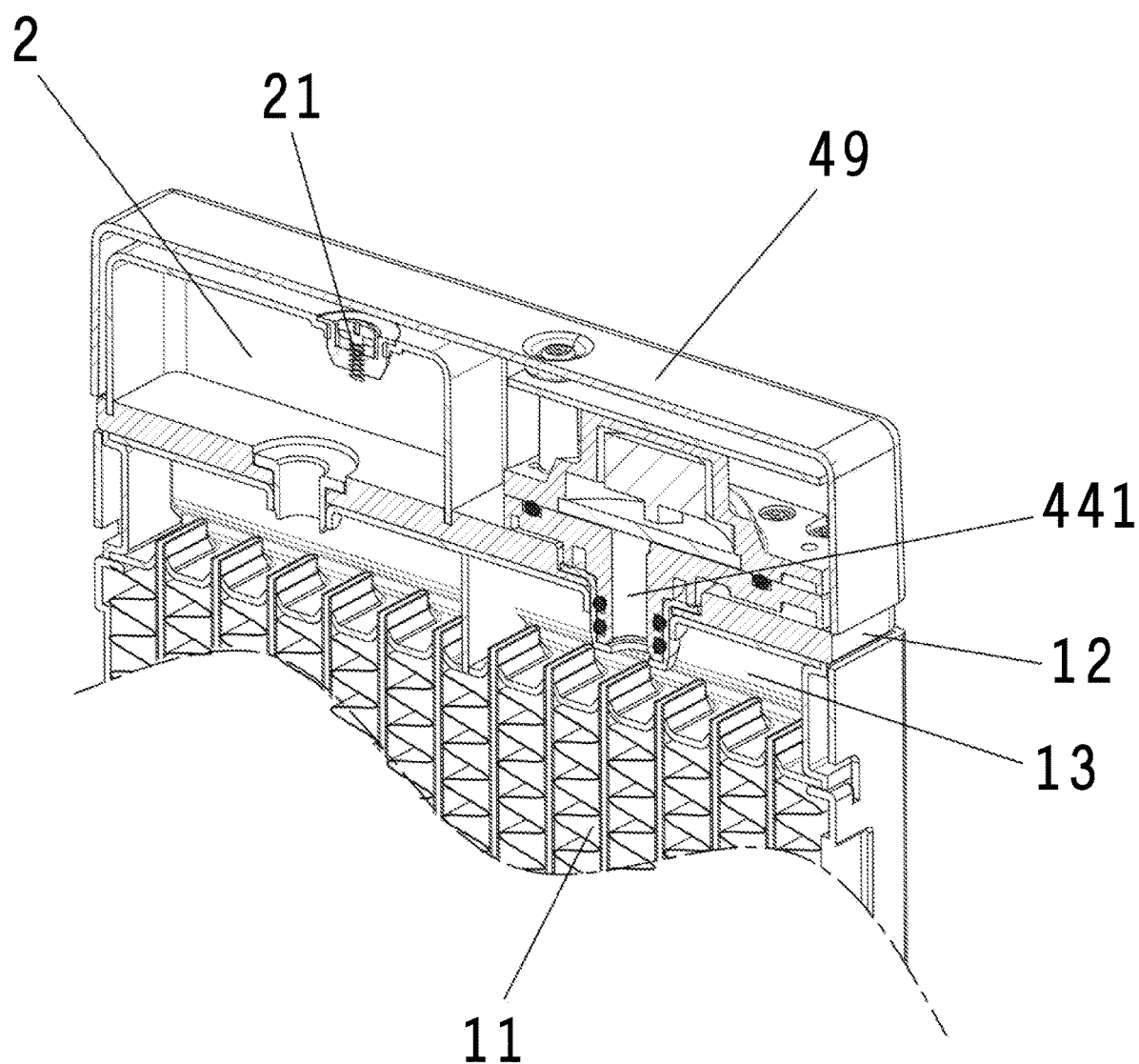
FIG. 5 is a sectional view of part of the components of the invention.

As shown in FIGS. 1-5, an integrated radiator provided with a water chamber, a control panel, and a water pump comprises a cooler 1, and cooling liquid is contained in the cooler 1. The integrated radiator further comprises a first water chamber 2, a control panel 3, and a water pump assembly 4. The first water chamber 2 is communicated with a first water nozzle 51. The water pump assembly 4 is communicated with a second water nozzle 52. The first water chamber 2, the control panel 3, and the water pump assembly 4 are all arranged at one end or one side of the cooler 1. The first water chamber 2 and the water pump assembly 4 are communicated with the cooler 1. The water pump assembly 4 is electrically connected with the control panel 3. The control panel 3 is provided with a port set 31 electrically connected with the control panel 3.

Particularly, the water pump assembly 4 comprises a stator 41, a mandrel 421, a rotor assembly 42, a water barrier cover 42 and a shell 44, wherein the shell 44 is communicated with the cooler 1, and the mandrel 421, the rotor assembly 42 and the water barrier cover 43 are all located in the shell 44; a first groove 45 is formed in the outer side of the shell 44, and the stator 41 is received in the first groove 45; a second groove 46 is formed in the inner side of the shell 44, a concave part of the second groove 46 is located outside the shell 44 to form a protrusion 47, the rotor assembly 42 is received in the second groove 46, and the first groove 45 is located around the protrusion 47; the mandrel 421 penetrates through two ends of the rotor assembly 42 to be separately connected with the water barrier cover 43 and the shell 44, and the rotor assembly 42 is rotatably connected with the mandrel 421; and the stator 41 is arranged on one end face of the control panel 3 and is electrically connected with the control panel 3.

Particularly, the rotor assembly 42 comprises a bearing 422 and a permanent magnet impeller 423, wherein the bearing 422 is arranged around the mandrel 421 and is received in the permanent magnet impeller 423, and the mandrel 421 penetrates through two ends of the bearing 422 to be connected with the shell 44 and the water barrier cover 43. Due to the fact that the number of revolutions of the permanent magnet impeller 423 is very large, the bearing 422 and the mandrel 421 are arranged to reduce the friction coefficient of the permanent magnet impeller 423 in the rotation process and to ensure the rotation precision of the permanent magnet impeller 423.

In actual use, the port set 31 of the control panel 3 is connected to an external power supply to supply power to the stator 41, and after being powered on, the stator 41 generates a magnetic field which in turn penetrates through the shell 44 to drive the permanent magnet impeller 423 to rotate under the restriction of the bearing 422, so that the cooling liquid is delivered in the cooler 1 and sequentially flows through the block, the second water nozzle 52, the water pump assembly 4, the cooler 1, the first water chamber 2, the first water nozzle 51 and the block cyclically, and the cooling liquid is cooled in the cooler 1, so that a CPU is cooled.

Particularly, the cooler 1 comprises a cooler body 11, a second water chamber 13, a third water chamber 14 and an installation plate 12, wherein the second water chamber 13 and the third water chamber 14 are separately arranged at two ends of the cooler body 11 and are communicated with the cooler body 11, and the installation plate 12 has an end face connected with one end of the second water chamber 13 and an end face provided with the first water chamber 2. In this embodiment, an outlet 441 extends out from the lower portion of the shell 44 and is communicated with the cooler 1, and the cooling liquid is pumped out of the second water chamber 13 by the water pump assembly 4 via the outlet 441; and a plurality of O-shaped rings are arranged around the outer wall of the outlet 441, so that the sealing effect of the outlet 441 and the cooler 1 is improved.

With gradual evaporation of the cooling liquid in the cooler 1, the liquid level of the cooling liquid in the cooler 1 becomes lower gradually, the water pump assembly 4 cannot pump cooling liquid out of the second water chamber 13 anymore when the liquid level of the cooling liquid is less than a certain limit, at this moment, the water pump assembly idles and fails to circulate the cooling liquid, and consequentially, the cooling effect cannot be realized, the temperature of the CPU is too high, and a host crash is caused; and a water pump body can be damaged due to idling of the water pump. To overcome these defects, three water chambers, namely the first water chamber 2, the second water chamber 13 and the third water chamber 14, are configured in this embodiment, so that the integrated water-cooling radiator in this embodiment can be filled with more cooling liquid and can contain much more cooling liquid over traditional coolers, thereby having a longer service life.

In addition, the first water chamber 2 is provided with a water injection hole 21, so that cooling liquid can be injected into the cooler 1 at any time.

Particularly, the first water chamber 2, the installation plate 12, the second water chamber 13, the cooler body 11 and the third water chamber 14 are integrally formed. Preferably, the first water chamber 2, the installation plate 12, the second water chamber 13, the cooler body 11 and the third water chamber 14 are integrally formed through welding. The pressure in the cooler 1 will become excessively high after gas is generated due to heat expansion and cold contraction of the cooling liquid and chemical reactions of the cooling liquid with substances in the integrated water-cooling radiator, and in this case, local weak areas of the integrated water-cooling radiator may be fractured, which in turn causes water leakage. Through the design in this embodiment, the overall strength of the cooler 1 is improved, and therefore, liquid leakage of the cooler 1 is prevented.

The integrated radiator provided with the water chamber, the control panel, and the water pump in this embodiment has the following beneficial effects:

1. The load of the mainboard is reduced: particularly, according to the integrated radiator provided with the water chamber, the control panel, and the water pump, the water pump assembly 4 is installed on the cooler 1, so that the weight of the block is reduced; and as the case is generally vertically placed, the reduction of the weight of the block reduces the load applied to the mainboard by the block, and accordingly, the service life of the mainboard is prolonged.

2. The stability of the CPU and the mainboard is prevented from being affected by the block. Particularly, based on the fact that the water pump generates vibration in work, the integrated radiator provided with the water chamber, the control panel, and the water pump in this embodiment has the water pump assembly 4 installed on the cooler 1, and the block exchanges heat only with the CPU, so that the mainboard and the CPU can work without being affected by the water pump assembly 4, and accordingly, the working stability of the host is improved, and the service life of the host is prolonged.

3. The internal attractiveness of the case is improved. Particularly, the integrated radiator provided with the water chamber, the control panel, and the water pump in this embodiment has the control panel 3 integrated on the cooler 1, wires guided out of the fan and the block of the radiator are reasonably configured on the cooler 1 or a water pipe and are then inserted into the port set 31 of the control panel 3 for centralized power supply and control, and power supply lines are guided out of the control panel 3, so that the internal attractiveness of the case is maintained.

4. The service life of the integrated water-cooling radiator is prolonged. Particularly, the integrated radiator provided with the water chamber, the control panel, and the water pump has the first water chamber integrated on the cooler, so that more cooling liquid can be contained and can be supplemented in time, and therefore, the service life of the integrated water-cooling radiator is prolonged.

According to the integrated radiator provided with the water chamber, the control panel, and the water pump in this embodiment, the control panel 3 is provided with a first positioning hole 32 matched with the protrusion 47, the shell 44 is provided with a plurality of positioning columns 48, the control panel 3 is further provided with a plurality of second positioning holes 33 matched with the positioning columns 48, and through the cooperation between the protrusion 47 and the first positioning hole 32, as well as the cooperation between the positioning columns 48 and the second positioning holes 33, the control panel 3 is positioned and is prevented from moving.

According to the integrated radiator provided with the water chamber, the control panel, and the water pump in this embodiment, a housing 49 is provided with a plurality of through holes 40 matched with the port set 31 and is used to protect the control panel 3 and the water pump assembly 4, and the port set 31 is exposed via the through holes 40 so as to allow the wires of the fan or other fittings to be inserted therein.

In this embodiment, the control panel 3 comprises a water pump driver module and a port set power supply and control module, wherein the water pump driver module is used for driving the water pump assembly, and the port set power supply and control module is used for supplying power and control signals to the block and the fan. The port set 31 includes three ports. In actual use, a desired number of ports can be configured according to user requirements, and all these ports are welded to the control panel 3 so as to be connected with circuits on the control panel 3.

By the way, the above embodiments are only used to explain the technical solution of the invention and are not intended to limit the protection scope of the invention. In spite of the detailed description, with reference to these preferred embodiments, of the invention, those ordinarily skilled in this field would appreciate that various modifications or equivalent substitutes of the technical solution can be made without deviating from its essence and scope

What is claimed is:

1. An integrated radiator provided with a water chamber, a control panel, and a water pump, comprising
    a cooler (1) having cooling liquid contained therein, and further comprising a first water chamber (2), a control panel (3) and a water pump assembly (4) containing the water pump,
    wherein the first water chamber (2), the control panel (3) and the water pump assembly (4) are arranged at one end or one side of the cooler (1), the first water chamber (2) and the water pump assembly (4) are communicated with the cooler (1), the water pump assembly (4) is electrically connected with the control panel (3), and the control panel (3) is provided with a port set (31) electrically connected with the control panel (3);
    wherein the water pump assembly (4) comprises a stator (41), a mandrel (421), a rotor assembly (42), a water barrier cover (43) and a shell (44); the shell (44) is communicated with the cooler (1), and the mandrel (421), the rotor assembly (42) and the water barrier cover (43) are located in the shell (44); a first groove is formed in an outer side of the shell (44), and the stator (41) is received in the first groove (45); a second groove (46) is formed in an inner side of the shell (44), the second groove (46) having a concave part which protrudes the outer side of the shell (44) to form a protrusion (47), the rotor assembly (42) is received in the second groove (46), and the first groove (45) is located around the protrusion (47); the mandrel (421) penetrates through two ends of the rotor assembly (42) to be connected with the water barrier cover (43) and the shell (44), and the rotor assembly (42) is rotatably connected with the mandrel (421); and the stator (41) is arranged on one end face of the control panel (3) and is electrically connected with the control panel (3); and the shell (44) is provided with a plurality of positioning columns (48), and the control panel (3) is provided with a plurality of second positioning holes (33) matched with the positioning columns (48).

2. The integrated radiator provided with the water chamber, the control panel, and the water pump according to claim 1, wherein the first water chamber (2) is communicated with a first water nozzle (51), and the water pump assembly (4) is communicated with a second water nozzle (52).

3. The integrated radiator provided with the water chamber, the control panel, and the water pump according to claim 1, wherein the cooler (1) comprises a cooler body (11), a second water chamber (13), a third water chamber (14) and an installation plate (12); the second water chamber (13) and the third water chamber (14) are separately arranged at opposite ends of the cooler body (11) and are communicated with the cooler body (11), and the installation plate (12) has an end face connected with one end of the second water chamber (13) and an end face provided with the first water chamber (2); and the first water chamber (2), the installation plate (12), the second water chamber (13), the cooler body (11) and the third water chamber (14) are integrally formed.

4. The integrated radiator provided with the water chamber, the control panel, and the water pump according to claim 3, wherein the first water chamber (2) is provided with a water injection hole (21).

5. The integrated radiator provided with the water chamber, the control panel, and the water pump according to claim 1, wherein the rotor assembly (42) comprises a bearing (422) and an impeller (423), the bearing (422) is arranged around the mandrel (421) and is received in the impeller (423), and the mandrel (421) penetrates through two ends of the bearing (422) to be connected with the shell (44) and the water barrier cover (43); wherein
    the impeller (423) is a permanent magnet.

6. The integrated radiator provided with the water chamber, the control panel, and the water pump according to claim 1, wherein the control panel (3) is provided with a first positioning hole (32) matched with the protrusion (47).

7. The integrated radiator provided with the water chamber, the control panel, and the water pump according to claim 1, wherein a housing (49) is arranged at one end of the cooler (1), and the first water chamber (2), the control panel (3) and the water pump assembly (4) are located in the housing (49); and the housing (49) is provided with at least one through hole (40) matched with the port set (31).

8. The integrated radiator provided with the water chamber, the control panel, and the water pump according to claim 1, wherein the control panel (3) comprises a water pump driver module and a port set power supply and control module, the water pump driver module is used for driving the water pump assembly, and the port set power supply and control module is used for supplying power and control signals to a pump and a fan.

* * * * *